United States Patent [19]
Buynoski

[11] Patent Number: 6,078,088
[45] Date of Patent: Jun. 20, 2000

[54] LOW DIELECTRIC SEMICONDUCTOR DEVICE WITH RIGID LINED INTERCONNECTION SYSTEM

[75] Inventor: Matthew S. Buynoski, Palo Alto, Calif.

[73] Assignee: Advanced Micro Devices, Inc., Sunnyvale, Calif.

[21] Appl. No.: 09/225,541

[22] Filed: Jan. 5, 1999

[51] Int. Cl.[7] .................... H01L 29/76; H01L 29/94; H01L 29/00
[52] U.S. Cl. .................... 257/410; 257/522; 257/506; 257/554; 257/754; 257/758; 257/774; 257/638; 257/756; 438/584; 438/421; 438/422; 438/319; 438/614
[58] Field of Search ........................ 257/410, 522, 257/506, 554, 754, 758, 774, 638, 756; 438/584, 421, 422, 319, 614

[56] References Cited

U.S. PATENT DOCUMENTS

| | | |
|---|---|---|
| 5,413,962 | 5/1995 | Lur et al. .................... 437/195 |
| 5,708,303 | 1/1998 | Jeng . |
| 5,783,864 | 7/1998 | Dawson et al. .................... 257/758 |
| 5,798,559 | 8/1998 | Bothra et al. .................... 257/522 |

FOREIGN PATENT DOCUMENTS 2247986   3/1992   United Kingdom .

*Primary Examiner*—David Hardy
*Assistant Examiner*—Matthew Warren

[57] ABSTRACT

Multi-level semiconductor devices are formed with reduced parasitic capacitance without sacrificing structural integrity or electromigation performance by removing the inter-layer dielectrics and supporting the interconnection system with a rigid lining. Embodiments include depositing a dielectric sealing layer, e.g., silicon oxide, silicon nitride or composite of silicon oxide/silicon nitride, before forming the first metallization level, removing the inter-layer dielectrics after forming the last metallization level, lining the interconnection system with undoped polycrystalline silicon and forming a dielectric protective layer, e.g. a silane derived oxide, on the uppermost metallization level.

22 Claims, 4 Drawing Sheets

LOW DIELECTRIC SEMICONDUCTOR DEVICE WITH RIGID LINED INTERCONNECTION SYSTEM

RELATED APPLICATIONS

This application contains subject matter similar to subject matter disclosed in Copending U.S. patent applications Ser. No.: 09/252,185 filed on Feb. 18, 1999, Ser. No.: 09/252,186 filed on Feb. 18, 1999, Ser. No.: 09/252,184 filed on Feb. 18, 1999, and Ser. No.: 09/252,183 filed on Feb. 18, 1999.

TECHNICAL FIELD

The present invention relates to a semiconductor device with reduced capacitance loading, and to a method of manufacturing the semiconductor device. The invention has particular applicability in manufacturing high density, multi-level semiconductor devices comprising submicron dimensions.

BACKGROUND ART

The escalating requirements for high density and performance associated with ultra large scale integration semiconductor wiring require responsive changes in interconnection technology. Such escalating requirements have been found difficult to satisfy in terms of providing a low RC (resistance capacitance) interconnection pattern, particularly wherein submicron vias, contacts and trenches have high aspect rations due to miniaturization.

Conventional semiconductor devices typically comprise a semiconductor substrate, typically undoped monocrystalline silicon, and a plurality of sequentially formed inter-layer dielectrics and patterned metal layers. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via opening, while a conductive plug filling a contact opening establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink into the deep submicron range.

A conductive plug filling a via opening is typically formed by depositing an inter-layer dielectric on a patterned conductive (metal) layer comprising at least one metal feature, forming an opening in the inter-layer dielectric by conventional photolithographic and etching techniques, and filling the opening with a conductive material, such as tungsten (W). Excess conductive material on the surface of the inter-layer dielectric is removed by chemical-mechanical polishing (CMP). One such method is known as damascene and basically involves the formation of an opening which is filled in with a metal. Dual damascene techniques involve the formation of an opening comprising a lower contact or via opening section in communication with an upper trench opening section, which opening is filled with a conductive material, typically a metal, to simultaneously form a conductive plug in electrical contact with a conductive line.

High performance microprocessor applications require rapid speed of semiconductor circuitry. The speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the RC delay caused by the interconnect wiring increases. If the interconnection node is routed over a considerable distance, e.g., hundreds of microns or more, as in submicron technologies, the interconnection capacitance limits the circuit node capacitance loading and, hence, the circuit speed. As design rules are reduced to about 0.18 micron and below, the rejection rate due to integrated circuit speed delays severely limits production throughput and significantly increases manufacturing costs. Moreover, as line widths decrease, electrical conductivity and electromigration resistance become increasingly important.

As device geometries shrink and functional density increases, it becomes increasingly imperative to reduce the capacitance between metal lines. Line-to-line capacitance can build up to a point where delay time and cross talk may hinder device performance. Reducing the capacitance within multi-level metallization systems will reduce the RC constant, cross talk voltage, and power dissipation between the lines.

One way to increase the speed of semiconductor circuitry is to reduce the resistance of a conductive pattern. Conventional metallization patterns are typically formed by depositing a layer of conductive material, notable aluminum or an alloy thereof, and etching, or by damascene techniques wherein trenches are formed in dielectric layers and filled with conductive material. The use of metals having a lower resistivity than aluminum, such as copper, engenders various problems which limit their utility. For example, copper readily diffuses through silicon dioxide, the typical dielectric material employed in the manufacture of semiconductor devices, and adversely affects the devices. In addition, copper does not form a passivation film, as does aluminum. Hence, a separate passivation layer is required to protect copper from corrosion.

The dielectric constant of materials currently employed in the manufacture of semiconductor device for inter-layer dielectrics (ILD) spans from about 3.9 for dense silicon dioxide to over 8 for deposited silicon nitride. Prior attempts have been made to reduce the interconnect capacitance and, hence, increase the integrated circuit speed, by developing dielectric materials having a lower dielectric constant than that of silicon dioxide. New materials having low dielectric constants, such as low dielectric constant polymers, teflon and porous polymers have been developed. There has been some use of certain polyimide materials for ILDs which have a dielectric constant slightly below 3.0.

Recent attempts have also resulted in the use of low-density materials, such as an aerogel, which has a lower dielectric constant than dense silicon oxide. The dielectric constant of a porous silicon dioxide, such as an aerogel, can be as low as 1.2, thereby potentially enabling a reduction in the RC delay time. However, conventional practices for producing an aerogel require a supercritical drying step, which increases the cost and degree of complexity for semiconductor manufacturing. Moreover, the use of an aerogel results in a semiconductor device which lacks sufficient structural integrity.

Prior attempts to reduce parasitic RC time delays also include the formation of various types of air gaps or bridges.

See, for example, Lur et al., U.S. Pat. No. 5,413,962, Jeng, U.S. Pat. No. 5,708,303 and Saul et al., UK Patent GB2, 247,986A. However, the removal of ILD material becomes problematic in various respects. Firstly, the removal of ILD material adversely impacts the structural integrity of the resulting semiconductor device rendering it unduly fragile. Secondly, the removal of ILD materials results in a significant reduction in electromigration resistance of the conductors due to exposed free surfaces.

Accordingly, there exists a need for a semiconductor device having reduced parasitic RC time delays with reduced internal capacitance without sacrificing structural integrity and/or electromigration performance.

DISCLOSURE OF THE INVENTION

An advantage of the present invention is a semiconductor device exhibiting reduced parasitic RC time delays without sacrifice of structural integrity and/or electromigration performance.

Another advantage of the present invention is a method of manufacturing a semiconductor device exhibiting reduced parasitic RC time delays without sacrifice of structural integrity and/or electromigration performance.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device comprising a substrate having active regions; and an interconnection system comprising: a first patterned metal layer, comprising metal features, over the substrate; a plurality of patterned metal layers, each patterned metal layer containing metal features, over the first patterned metal layer terminating with an uppermost patterned metal layer; vias electrically connecting metal features of different patterned metal layers; contacts electrically connecting active regions to metal features of the first patterned metal layer; air gaps between the patterned metal layers, metal features, and vias; and a liner, comprising a material different from the metal features, on the metal features and vias.

Another aspect of the present invention is a method of manufacturing a semiconductor device, the method comprising: forming a substrate with active regions; forming an interconnection system comprising: a first patterned metal layer, over the substrate, having metal features electrically connected to active regions by contacts; a plurality of patterned metal layers over the first patterned metal layer terminating with an uppermost patterned metal layer, each patterned metal layer having metal features electrically connected to metal features of different patterned metal layers by vias; and an inter-layer dielectric between patterned metal layers; removing the inter-layer dielectrics; and forming a liner, comprising a material different from the patterned metal layers, on the metal features and vias.

Embodiments include forming a dielectric sealing layer on the semiconductor substrate below the first patterned metal layer, and forming a dielectric protective layer on the uppermost metal layer. Embodiments of the present invention also include employing a lead-rich glass, a benzocyclobutene (BCB) resin or low temperature silica as the ILD material, and employing undoped polycrystalline silicon as the liner.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
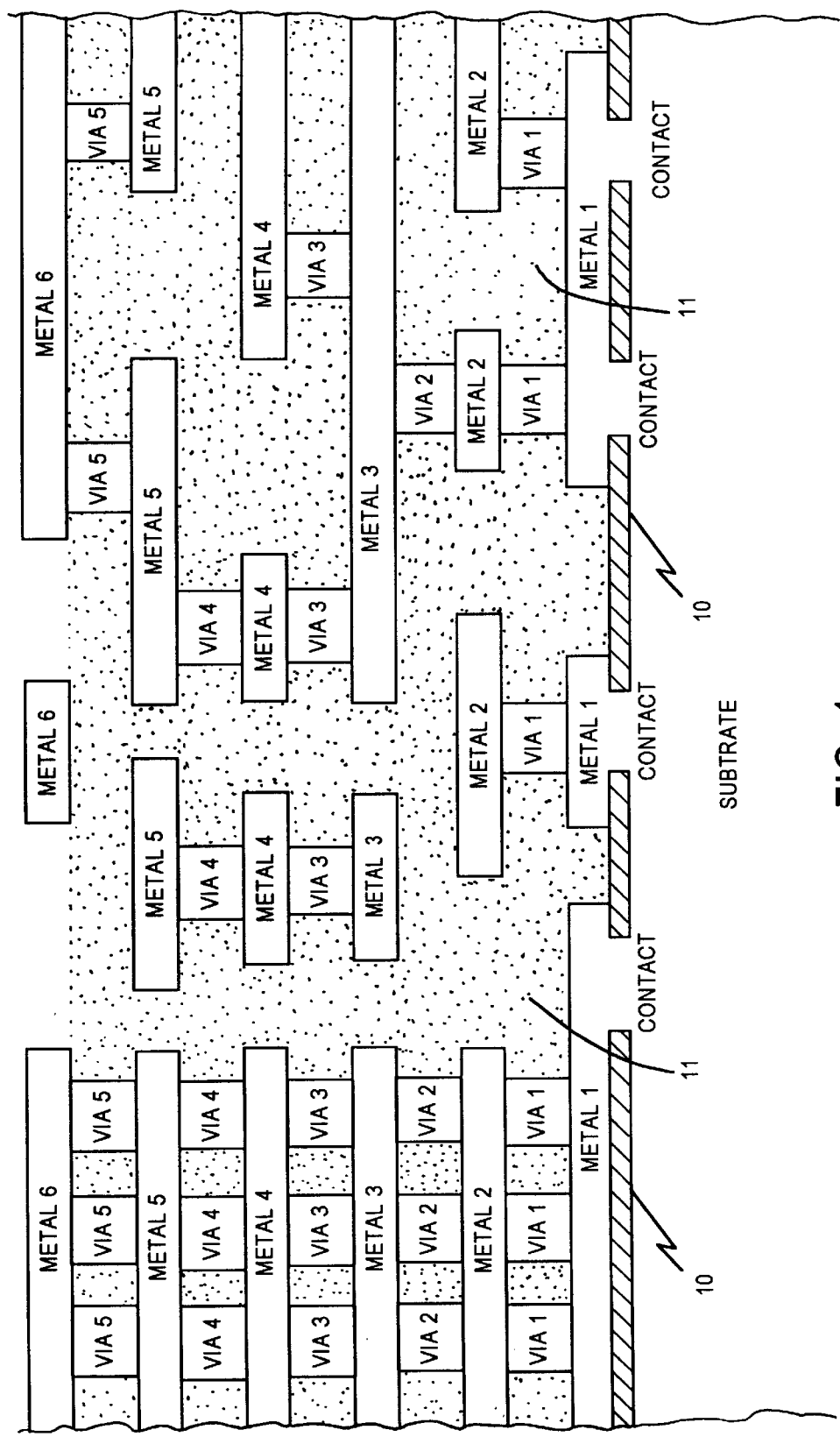
FIGS. 1–4 represent sequential phases of a method in accordance with an embodiment of the present invention, wherein like elements are denoted by like reference numerals.

The present invention addresses and solves problems attendant upon conventional multi-layer interconnection devices, particularly parasitic RC time delays. The capacitance, both layer-to-layer and within-layer, is primarily attributed to the film properties of the ILD. Prior attempts to remove ILDs by creating air tunnels or air gaps create significant structural integrity problems and result in a significant lose of electromigration resistance due to the exposed free surfaces of the conductors. The present invention enables the manufacture of semiconductor devices with a significantly reduced parasitic RC time delay be reducing both the layer-to-layer and within-layer capacitance without adversely impacting structural integrity and without lowering electromigration resistance. Embodiments of the present invention comprise removing the ILDs and providing a stiffing element or liner on the surfaces of the interconnection system, e.g., metal lines and vias. The resulting stiffened, lined interconnection system comprises air gaps between the patterned metal layers, metal features and vias. The air gaps are, desirably, substantially continuous throughout the interconnection system and substantially reduce the capacitance of the interconnection system. The rigid liner enhances the structural integrity of the resulting semiconductor device and prevents a reduction in electromigration performance by encapsulating the exposed conductive surfaces.

Embodiments of the present invention comprise depositing a sealing layer either just above the local interconnect or first contact layer in the process sequence, e.g., on the semiconductor substrate below the first metallization layer. The sealing layer is ideally selected such that it is impermeable to the ILD removal technique employed. It is particularly suitable to form a sealing layer which rejects deposition of the subsequent lining material. Suitable materials for the sealing layer include silicon dioxide, silicon oxynitride, silicon nitride, or composite combinations thereof.

Virtually any removable dielectric material can be employed in forming the ILDs in accordance with the present invention. It is desirable, however, to select dielectric materials which can be readily removed, e.g., dissolved, without damage to the metal conductors and which, themselves, will not be damaged or destroyed by conventional processing conditions, such as photoresist removal and metal etching. It has been found suitable to employ, as an ILD material, a lead-rich glass capable of being dissolved in acetic acid. Other suitable materials for the ILDs include a benzocyclobutene (BCB)-type resin which is stable with respect to an oxygen-containing plasma conventionally employed to remove photoresist material, but capable of being removed by exposure to a mixed oxygen-fluorine plasma. Another suitable material for the ILDs is a very soft, low density, silica deposited at a relatively low temperature and capable of being removed with a non-acidic or weakly acidic buffered hydrofluoric acid. The latter, relatively porous silica, such as an aerogel, is compatible with current manufacturing capabilities in that virtually no contamination is introduced.

In practicing various embodiments of the present invention, it is advantageous to select a lining material which imparts rigidity to the interconnection structure by enveloping the metal features, e.g., metal lines, and vias. It is also desirable to employ a deposition techniques capable of penetrating into highly convoluted narrow passages characteristic of multi-level interconnection systems, such that the interconnection system is substantially continuously enveloped by the rigid lining material. Suitable stiffening material for the liner comprises undoped polycrystalline silicon which is rigid and is capable of being deposited with extremely high conformability. Since polycrystalline silicon is not highly electrically conductive, it provides a higher resistivity and, hence, low leakage, if some of the polycrystalline silicon deposits on the sealing layer. In employing undoped polycrystalline silicon as the liner material, it was found advantageous to employ a sealing layer comprising silicon oxide, silicon nitride, or a dual layer of silicon oxide and a layer of silicon nitride thereon.

Embodiments of the present invention also include depositing a protective or passivation layer after depositing the liner on the conductors of the interconnection system. The protective or passivation layer is deposited above the uppermost patterned metal layer and serves as a final protective layer against environmental contaminants. Penetration of the protective layer into the air gaps can be prevented by overlapping the features of the uppermost patterned metal layer with the features of the immediately underlying patterned metal layer. Another alternative comprises forming narrow gaps between the features of the uppermost patterned metal layer to prevent protective layer penetration. Suitable materials for use as the dielectric protective layer include atmospheric pressure silane-base oxide depositions.

An embodiment of the present invention is schematically illustrated in FIGS. 1–4. Referring to FIG. 1 there is schematically illustrated a substrate, the active regions omitted for illustrative clarity. Contacts to active regions are identified. A dielectric sealing layer 10 is formed on the substrate and the first patterned metal layer (Metal 1) formed thereon. Dielectric sealing layer can be formed at a thickness of about 300 Å to about 1,000 Å. The illustrated device comprises six patterned metal layers (identified as Metal 1-Metal 6) with five levels of conductive vias (identified as Via 1-Via 5) electrically interconnecting features on spaced apart patterned metal layers. The ILDs comprise dielectric material 11, such as a silica aerogel, which appears throughout the interconnection structure.

Figure 2:
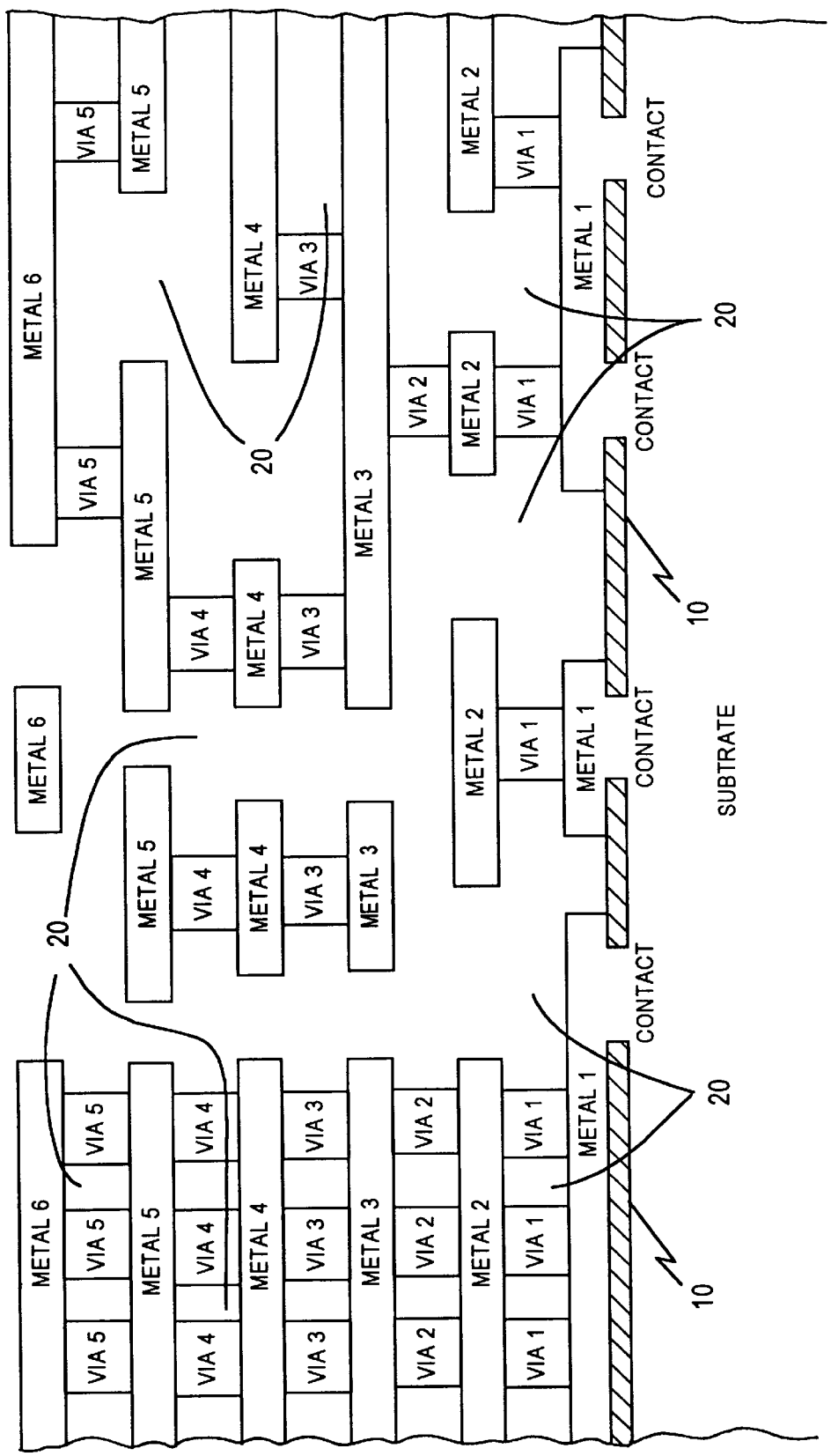

As shown in FIG. 2, the dielectric material 11 is removed, as with a slightly acidic buffered hydrofluoric acid solution, thereby creating voids or air gaps 20 throughout the interconnection structure. The formation of air gaps 20 significantly reduces the capacitance of the entire interconnection system as the dielectric constant of air is taken as one.

Figure 3:
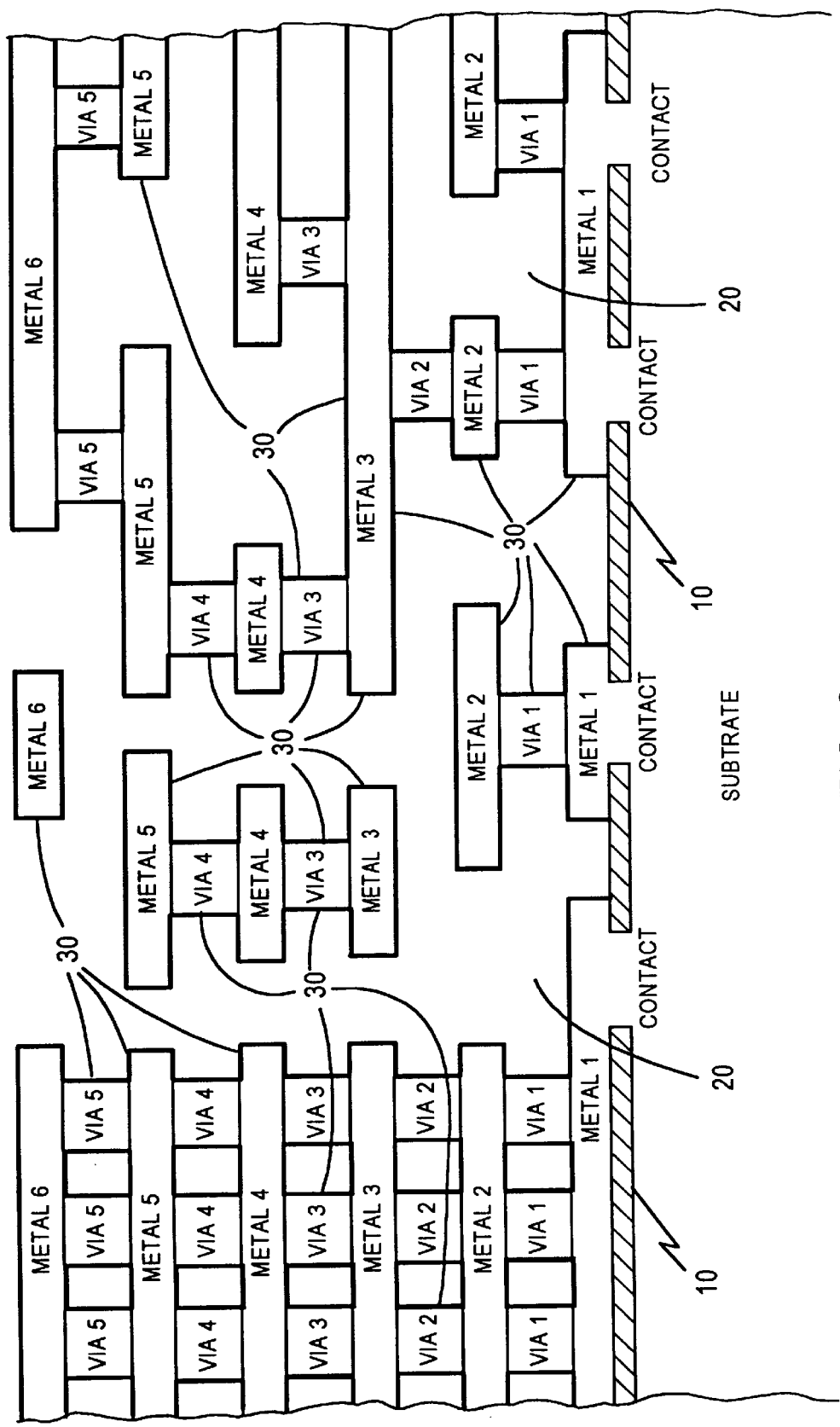
Figure 4:
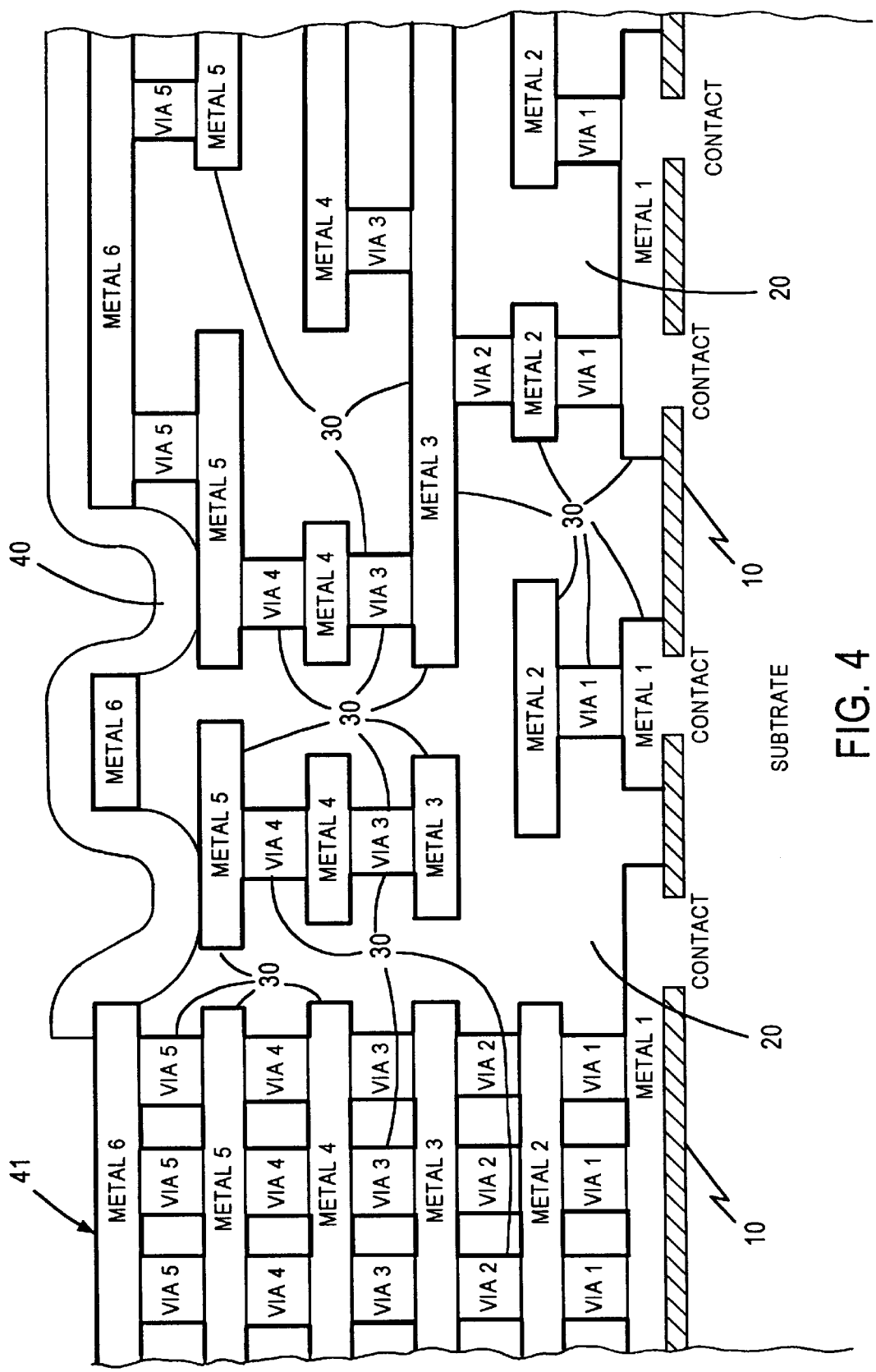

As shown in FIG. 3, a liner 30, e.g., undoped polycrystalline silicon, is applied to the interconnection system substantially enveloping the metal features and vias. Liner 30 provides structural rigidity to the entire interconnection system while preventing a decrease in electromigration resistance of the conductors. Subsequently, as shown in FIG. 4, a dielectric protective or passivation layer 40 is deposited to protect the device from environmental contaminants. Reference numeral 41 denotes the bonding pad area which is not covered by dielectric protective layer 40.

The present invention provides efficient, cost effective methodology for manufacturing highly integrated semiconductor devices exhibiting increased circuit speed by significantly reducing the capacitance of the interconnection system without adversely impacting structural integrity or electromigration performance. The present invention includes the use of various metals for the interconnection system, such as aluminum, aluminum alloys, copper, copper alloys, as well as tungsten plugs in forming vias. Patterned metal layers can be formed in any conventional manner, as by blanket deposition and etch back techniques or damascene techniques, including single and dual damascene techniques.

The present invention is industrially applicable to the manufacture of any of various type of semiconductor devices. The present invention enjoys particular applicable in manufacturing highly integrated, multi-level semiconductor devices having submicron features, e.g. a design rule of less than about 0.18 micron.

Only the preferred embodiment of the present invention and but a few examples of its versatility are shown and described in the present disclosure. It is to be understood that the present invention is capable of using various other combinations and environments and is capable of changes or modifications within the scope of the inventive concept as expressed herein.

What is claimed is:

1. A semiconductor device comprising:
    a substrate having active regions; and
    an interconnection system comprising:
        a first patterned metal layer, comprising metal features, over the substrate;
        a plurality of patterned metal layers, each patterned metal layer containing metal features, above the first patterned metal layer terminating with an uppermost patterned metal layer;
        vias electrically connecting metal features of different patterned metal layers;
        contacts electrically connecting active regions to metal features of the first patterned metal layer;
        air gaps substantially continuous between the patterned metal layers, metal features, and vias; and
        a liner, comprising a material different from the metal features, on the metal features and vias, wherein the interconnection is continuously enveloped by the liner.

2. The semiconductor device according to claim 1, further comprising a dielectric sealing layer between the substrate and first patterned metal layer.

3. The semiconductor device according to claim 2, further comprising a dielectric protective layer on the uppermost patterned metal layer.

4. A semiconductor device comprising:
    a substrate having active regions; and
    an interconnection system comprising:
        a first patterned metal layer, comprising metal features, over the substrate;
        a plurality of patterned metal layers, each patterned metal layer containing metal features, above the first patterned metal layer terminating with an uppermost patterned metal layer;

vias electrically connecting metal features of different patterned metal layers;

contacts electrically connecting active regions to metal features of the first patterned metal layer;

air gaps substantially continuous between the patterned metal layers, metal features, and vias; and a liner, comprising a material different from the metal features, on the metal features and vias, wherein the liner comprises undoped polycrystalline silicon.

5. The semiconductor device according to claim 4, wherein the undoped polycrystalline silicon liner has a thickness of about 500 Å to about 1,000 Å.

6. The semiconductor device according to claim 4, wherein the dielectric sealing layer comprises a silicon oxide, silicon nitride, or composite of silicon nitride on silicon oxide.

7. The semiconductor device according to claim 6, wherein the sealing layer has a thickness of about 500 Å to about 1,000 Å.

8. The semiconductor device according to claim 6, wherein the dielectric protective layer comprises an oxide.

9. The semiconductor device according to claim 8, wherein the oxide is derived from silane.

10. The semiconductor device according to claim 8, wherein the dielectric protective oxide layer has a thickness of about 10,000 Å to about 25,000 Å.

11. The semiconductor device according to claim 4, further comprising a dielectric sealing layer between the substrate and first patterned metal layer.

12. The semiconductor device according to claim 11, further comprising a dielectric protective layer on the uppermost patterned metal layer.

13. The semiconductor device according to claim 4, wherein the interconnection system is continuously enveloped by the liner.

14. A method of manufacturing a semiconductor device, the method comprising:

forming a substrate with active regions;

forming an interconnection system comprising:

a first patterned metal layer, over the substrate, having metal features electrically connected to the active regions by contacts;

a plurality of patterned metal layers over the first patterned metal layer terminating with an upper most patterned metal layer, each patterned metal layer having metal features electrically connected to metal features of different patterned metal layers by vias; and an inter-layer dielectric between patterned metal layers;

removing the inter-layer dielectrics; and forming a liner, comprising undoped polycrystalline silicon, on the features and vias.

15. The method according to claim 14, further comprising:

forming a dielectric sealing layer on the substrate; and forming the first patterned metal layer on the dielectric sealing layer.

16. The method according to claim 15, further comprising forming a dielectric protective layer on the uppermost patterned metal layer.

17. The method according to claim 16, comprising forming the inter-layer dielectrics by depositing layers of a: lead-rich glass soluble in acetic acid; benzocyclobutene resin; or silica at a temperature less than about 400° C.

18. The method according to claim 17, comprising:

forming the inter-layer dielectrics by depositing layers of a lead-rich glass; and removing the inter-layer dielectrics with acetic acid.

19. The method according to claim 17, comprising:

forming the inter-layer dielectrics by depositing layers of benzocyclobutene resin; and removing the inter-layer dielectrics with a mixed oxygen and fluorine plasma.

20. The method according to claim 17, comprising:

forming the inter-layer dielectrics by depositing layers of silica at a temperature less than about 400° C.; and removing the inter-layer dielectrics with a neutral or slightly acidic buffered hydrofluoric acid solution.

21. The method according to claim 14, wherein the dielectric sealing layer comprises a silicon oxide, silicon nitride, or composite of silicon nitride on silicon oxide.

22. The method according to claim 21, wherein the dielectric protective layer comprises an oxide.

* * * * *